(12) United States Patent
Lai

(10) Patent No.: US 9,006,090 B2
(45) Date of Patent: Apr. 14, 2015

(54) METHOD FOR FORMING SHIELDED GATE OF MOSFET

(71) Applicant: Mosel Vitelic Inc., Hsinchu (TW)

(72) Inventor: Richard Lai, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 14/020,441

(22) Filed: Sep. 6, 2013

(65) Prior Publication Data

US 2015/0037968 A1    Feb. 5, 2015

(30) Foreign Application Priority Data

Aug. 5, 2013 (TW) .............................. 102128009 A

(51) Int. Cl.
*H01L 21/4763* (2006.01)
*H01L 21/3205* (2006.01)
*H01L 21/336* (2006.01)
*H01L 21/28* (2006.01)

(52) U.S. Cl.
CPC ................................ *H01L 21/28008* (2013.01)

(58) Field of Classification Search
USPC ......................................... 438/585, 589, 270
See application file for complete search history.

(56) References Cited

U.S. PATENT DOCUMENTS

| | | | |
|---|---|---|---|
| 7,345,342 B2 * | 3/2008 | Challa et al. .................. | 257/341 |
| 2003/0068444 A1 * | 4/2003 | Ming-Hwa et al. ........... | 427/402 |
| 2006/0289929 A1 * | 12/2006 | Andrews ........................ | 257/330 |
| 2007/0037327 A1 * | 2/2007 | Herrick et al. ................ | 438/151 |
| 2007/0155104 A1 * | 7/2007 | Marchant et al. ............. | 438/270 |
| 2011/0291186 A1 * | 12/2011 | Yilmaz et al. ................. | 257/334 |

* cited by examiner

*Primary Examiner* — Karen Kusumakar

(74) *Attorney, Agent, or Firm* — Kirton McConkie; Evan R. Witt

(57) ABSTRACT

A method for forming a shielded gate of a MOSFET includes steps as following: providing a semiconductor substrate having at least one trench, forming a bottom gate oxide region and a shielded gate poly region in the trench of the semiconductor substrate, forming an inter-poly oxide region on the shielded gate poly region through high temperature plasma deposition, poly etching back and oxide etching back; and forming a gate oxide region and a gate poly region on the inter-poly oxide region. By utilizing the etching back processes in replace of traditional chemical mechanical polishing processes, the manufacturing cost of manufacturing a shielded gate structure is reduced, and the total cost of manufacturing a FET is also reduced. Meanwhile, the gate charge is effectively reduced due to the shielded gate structure, so that the performance of a MOSFET is enhanced.

9 Claims, 4 Drawing Sheets

2

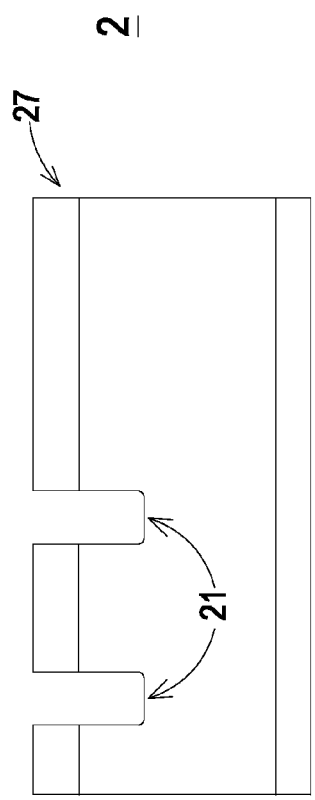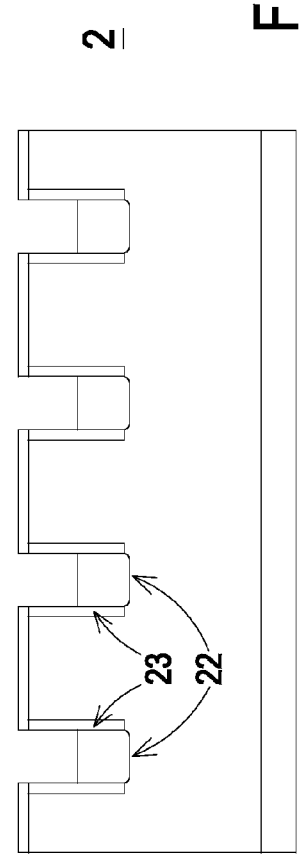

US 9,006,090 B2

METHOD FOR FORMING SHIELDED GATE OF MOSFET

FIELD OF THE INVENTION

The present invention relates to a metal oxide semiconductor field effect transistor, and more particularly to a method for forming a shielded gate of a metal oxide semiconductor field effect transistor by forming an inter-poly oxide region.

BACKGROUND OF THE INVENTION

In the semiconductor industry, there is no doubt that the most popular product is Metal Oxide Semiconductor Field Effect Transistor (hereinafter "MOSFET"). In recent years, due to the better characteristics, the trench MOSFET is progressively used in replace of the conventional MOSFET.

One of the trench MOSFETs, which is a trench MOSFET with a shielded gate structure, includes a shielded electrode, so that the Gate-Drain capacity is effectively reduced and the breakdown voltage of the transistor is effectively improved. As a result, the trench MOSFET with a shielded gate structure becomes more important development in the semiconductor industry.

Please refer to FIG. 1A to FIG. 1C. FIG. 1A to FIG. 1C schematically illustrate the structures corresponding to the steps of a conventional method for forming a shielded gate on a MOSFET of the prior art. The conventional method for forming a shielded gate on a MOSFET includes steps as follows. At first, depositing a hard mask layer 11 on a semiconductor substrate 1, and patterning a trench photo on the semiconductor substrate 1 and the hard mask layer 11. Next, Etching the hard mask layer 11. Then, photolithographing the trench photo (i.e. the yellow light process) for forming a trench 12. Next, etching the trench 12 (e.g. dry etching) for forming the structure as shown in FIG. 1A.

After removing the hard mask layer 11, forming a bottom gate oxide 121, depositing a shielded gate poly layer 122, and etching back the shielded gate poly layer 122 for forming the structure as shown in FIG. 1B. Next, after the structure shown in FIG. 1B is formed, processing a high density plasma (HDP) oxide deposition and processing a chemical mechanical polishing (CMP) for forming an inter-poly oxide 123. Finally, depositing a gate oxide 124 and a gate poly 125 for forming the structure as shown in FIG. 1C.

A conventional MOSFET with a shielded gate structure is manufactured by the above-mentioned method of prior art. However, the manufacturing cost of the chemical mechanical polishing method of the conventional method is relatively high and not easy to reduce, which causes the high cost of manufacturing a MOSFET.

There is a need of providing a method for forming a shielded gate of a MOSFET to obviate the drawbacks encountered from the prior art.

SUMMARY OF THE INVENTION

The present invention provides a method for forming a shielded gate of a MOSFET in order to eliminate the drawbacks of the high manufacturing cost of the MOSFET.

The present invention also provides a method for forming a shielded gate of a MOSFET. By utilizing the etching back processes in replace of conventional chemical mechanical polishing processes, the manufacturing cost of manufacturing a shielded gate structure is reduced, and the total cost of manufacturing a MOSFET is also reduced. Meanwhile, the gate charge is effectively reduced due to the shielded gate structure, so that the performance of the MOSFET is enhanced.

In accordance with an aspect of the present invention, there is provided a method for forming a shielded gate of a MOSFET. The method includes steps as following: providing a semiconductor substrate having at least one trench, forming a bottom gate oxide region and a shielded gate poly region in the trench of the semiconductor substrate, forming an inter-poly oxide region on the shielded gate poly region through high temperature plasma deposition, poly etching back and oxide etching back; and forming a gate oxide region and a gate poly region on the inter-poly oxide region.

The above contents of the present invention will become more readily apparent to those ordinarily skilled in the art after reviewing the following detailed description and accompanying drawings, in which:

BRIEF DESCRIPTION OF THE DRAWINGS

FIG. 2A to FIG. 2D schematically illustrate the structures corresponding to the steps of a method for forming a shielded gate of a MOSFET according to an embodiment of the present invention.

DETAILED DESCRIPTION OF THE PREFERRED EMBODIMENT

Figure 1A:
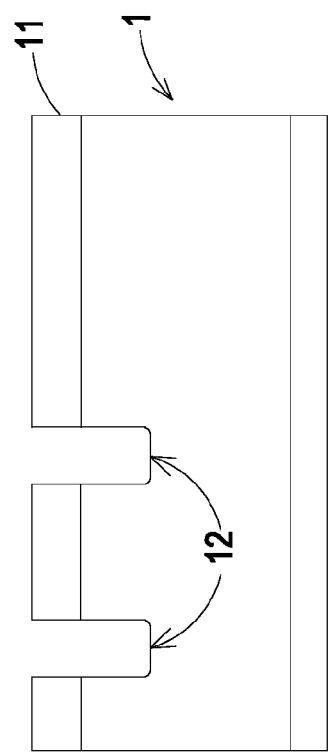
FIG. 1A to FIG. 1C schematically illustrate the structures corresponding to the steps of a conventional method for forming a shielded gate on a MOSFET of the prior art.
Figure 1B:
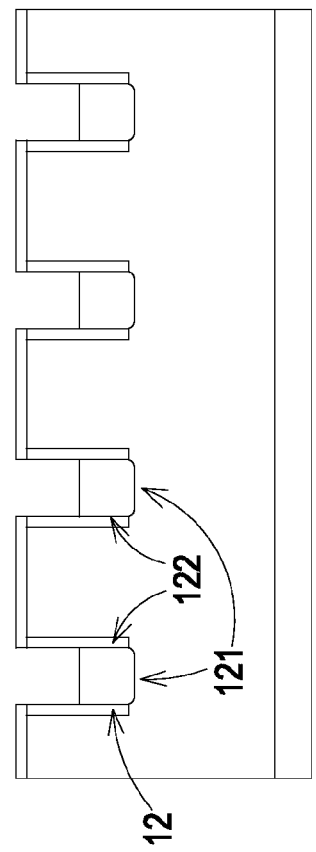
Figure 1C:
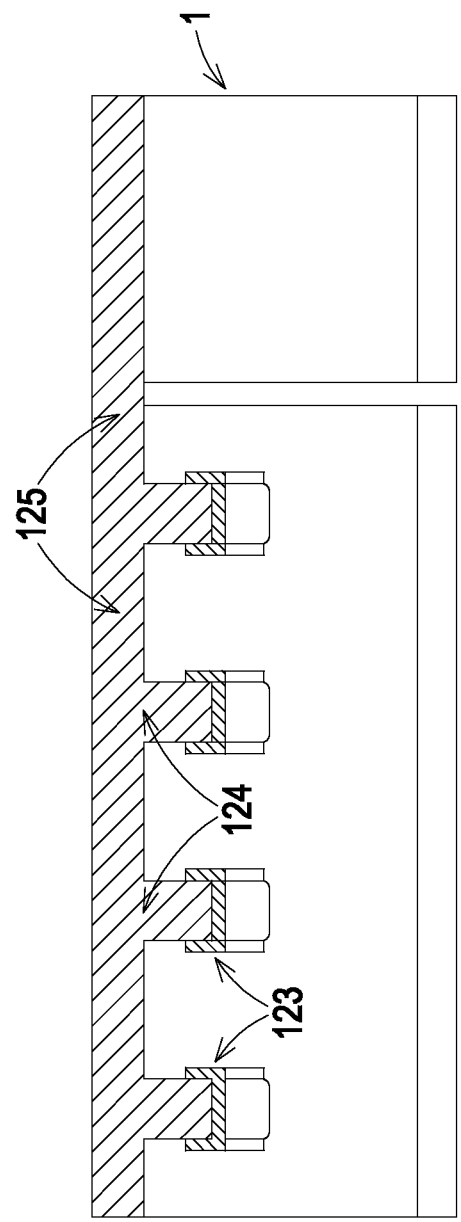

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Please refer to FIG. 2A to FIG. 2D. FIG. 2A to FIG. 2D schematically illustrate the structures corresponding to the steps of a method for forming a shielded gate of a MOSFET according to an embodiment of the present invention. As shown in FIG. 2A to FIG. 2D, the method for forming a shielded gate of a MOSFET of the present invention includes steps as following: providing a semiconductor substrate 2 having at least one trench 21, forming a bottom gate oxide region 22 and a shielded gate poly region 23 in the trench 21 of the semiconductor substrate 2, forming an inter-poly oxide region 24 on the shielded gate poly region 23 through high temperature plasma (HTP) deposition, poly etching back and oxide etching back; and forming a gate oxide region 25 and a gate poly region 26 on the inter-poly oxide region 24. An example of the semiconductor substrate 2 includes but not limited to a trench P-type semiconductor substrate or a trench N-type semiconductor. By utilizing the etching back processes in replace of conventional chemical mechanical polishing processes, the manufacturing cost of manufacturing a shielded gate structure is reduced, and the total cost of manufacturing a MOSFET is also reduced. Meanwhile, the gate charge is effectively reduced due to the shielded gate structure, so that the performance of the MOSFET is enhanced.

In some embodiments, the step of providing a semiconductor substrate 2 having at least one trench 21 further includes steps as follows. First, providing the semiconductor substrate 2. Next, depositing an oxide layer 27 on the semiconductor substrate 2, among which the oxide layer 27 is not limited to a hard mask layer. Then, patterning a trench photo on the semiconductor substrate 2 and the oxide layer 27. Next, etching the oxide layer 27 through wet etching or chemical etching. Further, photolithographing the trench photo for forming the trench 21 (i.e. through the yellow light process). Finally, etching the trench 21 for forming the structure as shown in FIG. 2A. The step of etching the trench 21 is implemented through dry etching.

In some embodiment, the step of forming a bottom gate oxide region 22 and a shielded gate poly region 23 in the trench 21 of the semiconductor substrate 2 further includes steps as follows. First, after removing the oxide layer 27, processing a bottom gate oxide growth on the bottom of the trench 21 for forming the bottom gate oxide region 22. Next, processing a poly-silicon deposition on the bottom gate oxide region for forming the shielded gate poly region 23. Then, etching back the shielded gate poly region 23 for forming the structure as shown in FIG. 2B.

Figure 2C:
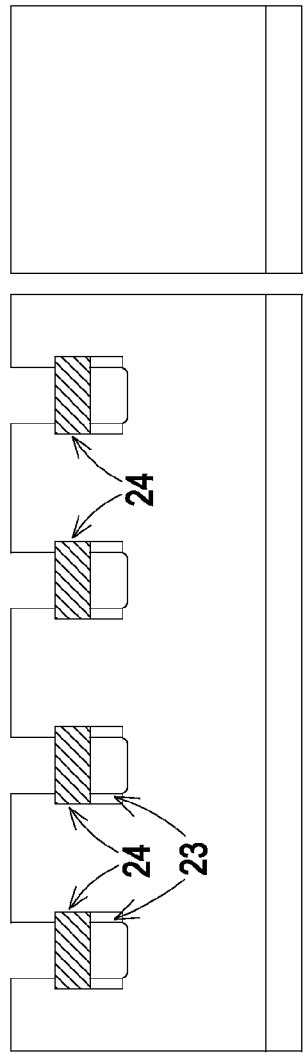

In some embodiments, the step of forming an inter-poly oxide region 24 on the shielded gate poly region 23 through high temperature plasma (HTP) deposition, poly etching back and oxide etching back further includes steps as follows. First, depositing an oxide through a high temperature plasma oxide deposition, among which a poly stopper is preferably formed through an overhang profile of the high temperature plasma oxide with narrow neck, but not limited thereto. Then, depositing a mask poly through a mask poly deposition, among which a void is formed in the trench 21 because of the conformal characteristic of poly (poly-silicon). Next, etching back the mask poly through etch selectivity. Since the mask poly is etched back with a high selectivity to oxide, the etching can be stopped on the poly stopper mentioned above, such as a film of the high temperature plasma oxide. Then, etching back the oxide. Since the high temperature plasma oxide is etched back with a high selectivity to poly, the oxide inside the trench 21 will be protected by the poly film. Finally, removing the mask poly and a portion of the oxide for forming the inter-poly oxide region 24 for forming the structure as shown in FIG. 2C. The inter-poly oxide region 24 of the present invention is formed through self-alignment and etching back, so the manufacturing cost is relatively lower than the cost of the chemical mechanical polishing of the conventional method. As a result, the manufacturing cost is lowered, and the total cost is reduced.

Figure 2D:
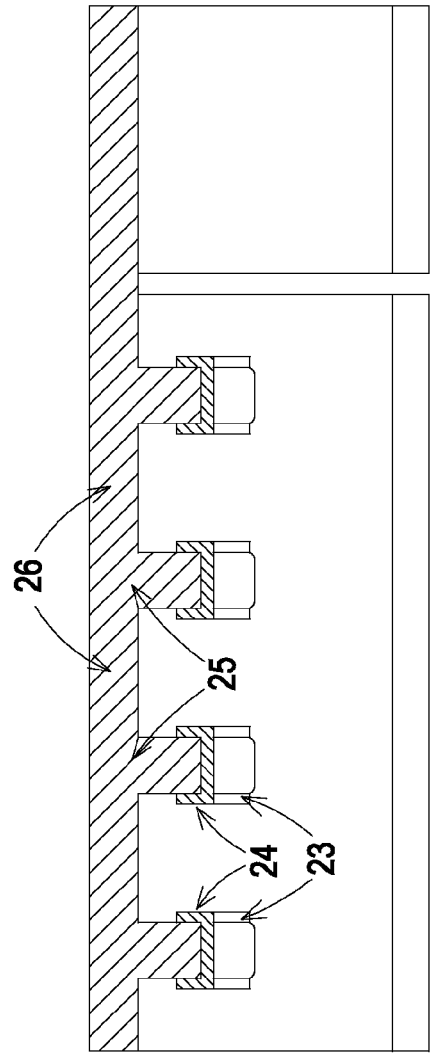

In another embodiment, the step of forming a gate oxide region 25 and a gate poly region 26 on the inter-poly oxide region 24 further includes two detailed steps as follows. First, processing a gate oxide deposition on the inter-poly oxide region 24 for forming the gate oxide region 25. Second, processing a gate poly deposition on the inter-poly oxide region 24 and the gate oxide region 25 for forming the gate poly region 26, and further the structure as shown in FIG. 2D is formed. It should be noted that the above-mentioned two detailed steps can be reversely performed, and the final structure will be similar to the structure as shown in FIG. 2D. In each embodiments of the present invention, the shielded gate structure of a MOSFET is similar to the semiconductor structure as shown in FIG. 2D.

From the above description, the present invention provides a method for forming a shielded gate of a MOSFET. By utilizing the etching back processes in replace of conventional chemical mechanical polishing processes, the manufacturing cost of manufacturing a shielded gate structure is reduced, and the total cost of manufacturing a MOSFET is also reduced. Meanwhile, the gate charge is effectively reduced due to the shielded gate structure, so that the performance of the MOSFET is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a shielded gate of a MOSFET, comprising steps of:
   (a) providing a semiconductor substrate having at least one trench;
   (b) forming a bottom gate oxide region and a shielded gate poly region in said trench of said semiconductor substrate;
   (c) forming an inter-poly oxide region on said shielded gate poly region through high temperature plasma deposition, poly etching back and oxide etching back, wherein said step (c) further comprises steps of:
      (c1) depositing an oxide through a high temperature plasma oxide deposition;
      (c2) depositing a mask poly through a mask poly deposition;
      (c3) etching back said mask poly;
      (c4) etching back said oxide; and
      (c5) removing said mask poly and a portion of said oxide for forming said inter-poly oxide region; and
   (d) forming a gate oxide region and a gate poly region on said inter-poly oxide region.

2. The method according to claim 1, wherein said step (a) further comprises steps of:
   (a1) providing said semiconductor substrate;
   (a2) depositing an oxide layer on said semiconductor substrate;
   (a3) patterning a trench photo on said semiconductor substrate and said oxide layer;
   (a4) etching said oxide layer;
   (a5) photolithographing said trench photo for forming said trench; and
   (a6) etching said trench.

3. The method according to claim 2, wherein said oxide layer is a hard mask layer, said step (a4) is implemented through wet etching, and said step (a6) is implemented through dry etching.

4. The method according to claim 1, wherein said step (b) further comprises steps of:
   (b1) processing a bottom gate oxide growth on a bottom of said trench for forming said bottom gate oxide region;
   (b2) processing a poly-silicon deposition on said bottom gate oxide region for forming said shielded gate poly region; and
   (b3) etching back said shielded gate poly region.

5. The method according to claim 1, wherein a poly stopper is formed through an overhang profile of a high temperature plasma oxide with narrow neck in said step (c1).

6. The method according to claim 1, wherein a void is formed in said trench in said step (c2).

7. The method according to claim 1, wherein said step (c3) and said step (c4) are implemented through etch selectivity.

8. The method according to claim 1, wherein said inter-poly oxide region is formed through self-alignment.

9. The method according to claim 1, wherein said step (d) further comprises steps of:
   (d1) processing a gate oxide deposition on said inter-poly oxide region for forming said gate oxide region; and (d2) processing a gate poly deposition on said inter-poly oxide region and said gate oxide region for forming said gate poly region.

\* \* \* \* \*